United States Patent [19]
Murphy

[11] Patent Number: 5,335,771
[45] Date of Patent: Aug. 9, 1994

[54] SPACER TRAYS FOR STACKING STORAGE TRAYS WITH INTEGRATED CIRCUITS

[75] Inventor: Robert H. Murphy, Merrimack, N.H.

[73] Assignee: R. H. Murphy Company, Inc., Amherst, N.H.

[21] Appl. No.: 47,702

[22] Filed: Apr. 14, 1993

Related U.S. Application Data

[63] Continuation of Ser. No. 675,381, Mar. 26, 1991, abandoned, which is a continuation-in-part of Ser. No. 587,966, Apr. 25, 1990, Pat. No. 5,103,976.

[51] Int. Cl.⁵ .............................. B65D 73/02
[52] U.S. Cl. .................. 206/328; 206/331; 206/501
[58] Field of Search ............... 206/328, 329, 331, 334, 206/564, 814, 501

[56] References Cited

U.S. PATENT DOCUMENTS

| | | | |
|---|---|---|---|
| 3,454,921 | 7/1969 | Coleman et al. | 206/331 |
| 3,469,686 | 9/1969 | Gutsche et al. | |
| 3,482,682 | 12/1969 | Cronkhite | 206/332 |
| 3,661,253 | 5/1972 | Cronkhite | |
| 3,746,157 | 7/1973 | I'Anson | 206/331 |
| 3,946,864 | 3/1976 | Hutson | 206/332 |
| 4,026,412 | 5/1977 | Henson | 206/332 |
| 4,057,142 | 11/1977 | Lechner et al. | |
| 4,210,243 | 7/1980 | McDowell | |
| 4,585,121 | 4/1986 | Capelle, Jr. | 206/332 |
| 4,671,407 | 6/1987 | Brutosky | 206/332 |
| 4,725,918 | 2/1988 | Bakker | |
| 4,792,042 | 12/1988 | Koehn et al. | 206/524.3 |
| 5,103,976 | 4/1992 | Murphy | 206/328 |

*Primary Examiner*—Paul T. Sewell
*Assistant Examiner*—Thomas P. Hilliard
*Attorney, Agent, or Firm*—Pearson & Pearson

[57] ABSTRACT

A system for storing integrated circuits in a stacked relationship comprising integrated circuit storage trays and spacer trays. Each integrated circuit storage tray has a storage pocket area for containing an integrated circuit. When portions of the integrated circuit protrude beyond the overall profile of the storage tray, a spacer tray can be interposed between adjacent storage trays. The spacer tray elevates an adjacent storage tray to clear the protruding portions of the integrated circuit. The spacer tray also includes tabs or other structures for overlying portions of each integrated circuit in an adjacent storage tray thereby to retain the integrated circuits within the storage tray.

14 Claims, 5 Drawing Sheets

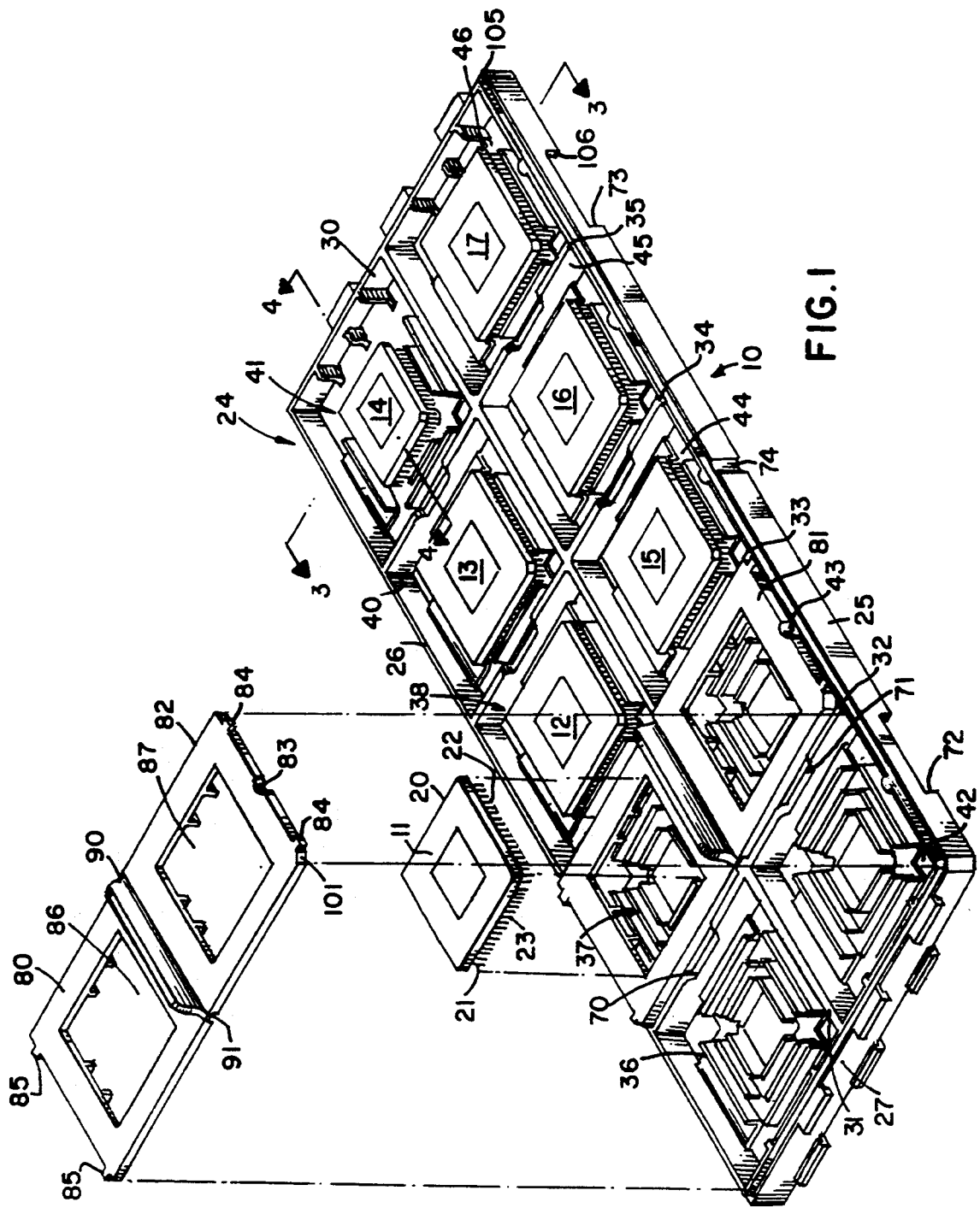

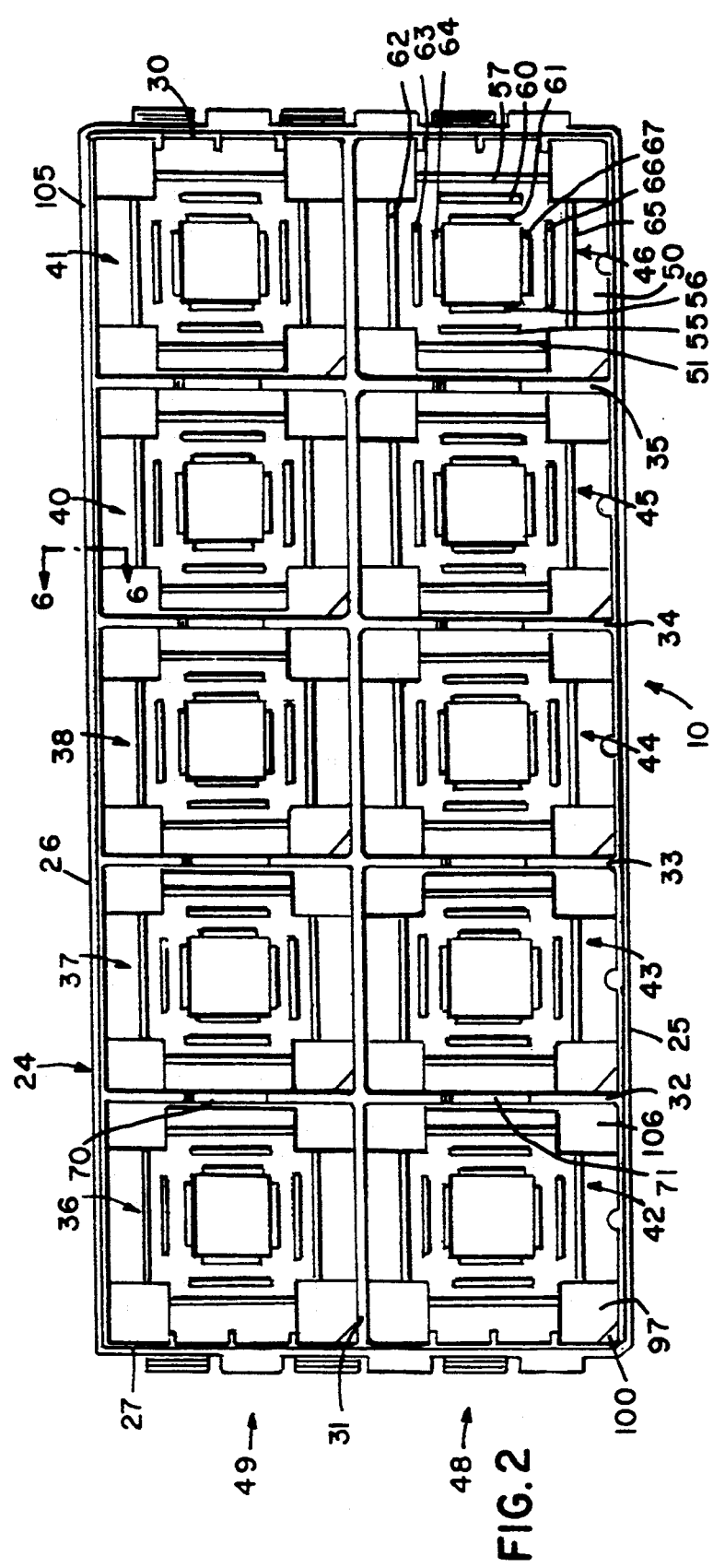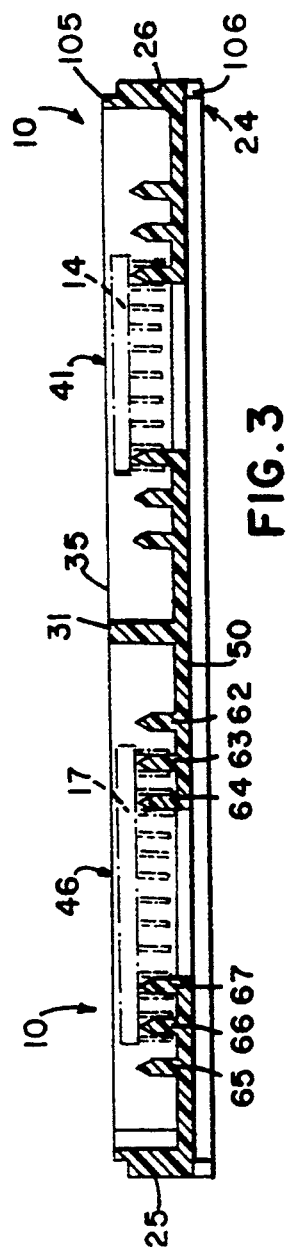

SPACER TRAYS FOR STACKING STORAGE TRAYS WITH INTEGRATED CIRCUITS

CROSS REFERENCE TO RELATED APPLICATIONS

This is a continuation application of my copending patent application Ser. No. 07/675,381 filed Mar. 26, 1991 (now abandoned) which is a continuation-in-part application of Ser. No. 07/587,966 filed Sep. 25, 1990 for a Tray for Integrated Circuits, now U.S. Pat. No. 5,103,976 issued Apr. 14, 1992.

BACKGROUND OF THE INVENTION

1. Field of the Invention

This invention generally relates to integrated circuits and more specifically to devices for the storage and transport of such integrated circuits.

2. Description of Related Art

The storage and transportation of semiconductor components have become important considerations in the production of electronic assemblies, especially as semiconductor components have matured from inexpensive, elementary circuit elements into expensive, sophisticated, complex circuit components. As these components have grown in complexity, they have become more susceptible to damage from a number of external influences, such as mechanical shock and discharges of accumulated electrostatic charge. Consequently, there have been many changes in the transportation, assembly and testing procedures that electronic assembly production facilities utilize. Such procedures, when properly implemented, now contribute significantly to the success of such electronic assembly facilities.

For example, in certain circumstances it is important to transport a component, such as an integrated circuit, pretest it, and provide ready access to the component for delivery to or insertion into a printed circuit board. "Chip carriers" now provide such functions for individual components. A "chip carrier" is a special fixture that houses and protects an individual component, such as an integrated circuit, from damage due to mechanical shock or electrostatic discharge during processing, production, testing and assembly operations. It also can orient an integrated circuit during the production process, assure proper placement and alignment of terminals for testing and for insertion into a printed circuit board.

In other circumstances, there may only be a requirement for the storage and shipment of large numbers of integrated circuits and like components without testing. For example, integrated circuit manufacturers ship such components to customers in bulk quantities. Some customers may desire to move such components in groups or sets directly to a printed circuit board. Other customers may desire to transport or store such components and then transfer the components to chip carriers or the like for further transportation and testing. When this limited requirement exists, it is difficult to justify the costs of purchasing and handling individual chip carriers.

There are a number of devices that store or carry semiconductor components and the like in a plurality of pockets. Examples of such devices are illustrated in the following U.S. Pat. Nos.:
3,469,686 (1969) Gutsche et al
3,482,682 (1969) Cronkhite
3,361,253 (1972) Cronkhite
3,946,864 (1976) Hutson
4,057,142 (1977) Lechner et al The Gutsche and both Cronkhite patents disclose a series of marginally registrable plastic trays. Each tray has a plurality of wells characterized by tapered walls that support a single semiconductor wafer within each well. The tapered walls prevent a polished face of a wafer from contacting any surface of the tray. It is possible to nest or stack individual trays for shipment as a unit. Thus, these trays provide a means for the bulk storage and transportation of semiconductor wafers. The Cronkhite patents provide a removable cap member that is disposed upon a rim-forming element of each well. Each cap member has a recessed portion that engages an upwardly presented surface of a semiconductor wafer to hold the wafer in a substantially immobile position in the well.

The Hutson patent discloses a package for semiconductor chips with first and second transparent plastic sheets that each contain an array of discrete and spaced depressions. When the sheets are stacked, the depressions in adjacent sheets nest and form a plurality of discrete compartments for containing the semiconductor chips. The sheets attach to each other about their peripheries to form a package for transmitting the chips in bulk. Apertures through each plastic sheet in the region of the compartments are smaller than the chips and allow access for physical testing and visual inspection while the chips remain constrained within the compartments.

The Lechner et al patent discloses a plastic pallet with plural circular depressions formed for containing semiconductor disks on an individual basis. When individual pallets are stacked on top of one another in opposite directions, they position part sector surfaces so they slope alternatively upward and downward. The upward sloping surface in one pallet is immediately above a downward sloping surface in an adjacent pallet. These counterfacing surfaces clamp the edges of the semiconductor disk so the disk can be transported with substantially no abrasion between the semiconductor disks and the pallets.

Although the foregoing references generally disclose devices for storing semiconductor wafers, such wafers do not have terminal pins that are normally encountered in finished integrated circuits. These trays are not readily adapted to devices with terminal pins. The following U.S. Pat. Nos. do disclose devices for the shipment and transportation of integrated circuit components or for circuits utilizing such integrated circuit components:
4,210,243 (1980) McDowell
4,725,918 (1988) Bakker
4,792,042 (1988) Koehn et al The McDowell patent discloses a tray for holding integrated circuit packages of the transistor outline type. Such packages have cylindrical cases with preformed leads that flair radially outward from the bottom of the package. Flat portions of the free ends of the leads lie in a common plane. A tray for transporting a plurality of such packages has a top plate with a plurality of funnel-shaped openings each having a cylindrical bottom portion for receiving a case. The top and bottom edges of the trays are dimensioned so that the top of a first tray nests inside the bottom of a second tray. When the nested trays are turned over, packages and openings in the first tray sit with the flat portions of their leads on the bottom of the second tray. A rim limits transverse movement of the packages set on the plate when the tray is shaken to cause them to fall into associated openings.

The Koehn et al patent discloses a chip carrier for individual electronic circuits. The chip carriers adapt for stacking for shipment. This enables a number of integrated circuit components to be shipped in bulk in a single package.

The Bakker patent discloses a box for storing electronic devices apparently including integrated circuits. The box includes a material that minimizes electrostatic accumulation and resultant discharges that could otherwise damage the electronic device.

Each of the foregoing references describes a device for use with a component of a single size or limited range of sizes. For example, semiconductor wafer and integrated circuit manufacturers use wafers of a given size or limited number of sizes. There are a limited number of transistor outline package sizes. As a result there is justification for the effort of designing specially formed trays or other devices according to the foregoing references.

However, these approaches do not adapt readily for the transportation and storage of pin grid array integrated circuit components. A pin grid array (PGA) integrated circuit component typically has a thin planar housing of a ceramic or other material for containing a semiconductor substrate and related circuitry. Terminal pins extend perpendicularly to one planar surface of the housing. The terminal pins define an array or matrix of columns and rows with an industry-standard spacing. Currently the spacing is 0.1 inch. PGA integrated circuit components come in myriad sizes that are defined alternatively by the size of the housing (from a 1 inch square to a 2.5 inch square) or by the size of the matrix (from a 9×9 terminal pin matrix to a 25×25 terminal pin matrix). Thus the adaption of a prior art design for accommodating PGA integrated circuit components would require a facility to inventory large number of specially sized trays.

A device for transporting and storing PGA integrated circuit components must also accommodate other characteristics inherent in such components. As previously indicated, many electronic assembly facilities now utilize robotic devices to retrieve a component from a storage device, orient that component accurately and position and insert the component with respect to a printed circuit board or a chip carrier. It is critical for the robotic device to "know" the position of the pins. If the robotic device only "sees" the housing, placement errors can result. Although tight tolerances exist with respect to the relative positions of the terminal pins, only relaxed tolerances exist as to the position of the terminal pin array with respect to the housing. The prior art trays and devices rely on the engagement of a housing or wafer edge. If such devices were adapted to PGA components, there would be no direct repeatable correlation between the tray and the terminal pins.

It also is desirable that any device for transporting and storing PGA integrated circuit components provide other desirable benefits. For example, it is possible for any number of external forces to transfer to the terminal pins with force components directed along and transversely to the terminal pins. To some degree, the device should protect the terminal pins from damage due to such mechanical shock during transport. The device also should prevent the accumulation of an electrostatic charge on the PGA integrated circuit component to avoid a potential discharge and damage.

U.S. Pat. No. 5,103,976 issued Apr. 14, 1992, discloses a tray for storage and transportation of multiple pin grid array (PGA) integrated circuit components. The tray has a lattice framework that defines discrete storage pocket areas. Each storage pocket area comprises a base support that spans portions of the framework and includes upstanding ribs that engage the integrated circuit component. The locus of the upstanding ribs of a given set constitutes a rectangle or square that is concentric with and spaced from the locus of other sets of upstanding ribs. Depending terminal pins from the housing lie between individual ones of the upstanding ribs. The trays are stackable.

These trays have a standard peripheral outline. It is highly desirable to maintain that outline for a wide variety of integrated circuits in order to standardize the storage trays. However, recent integrated circuit components have appeared that have a height that is greater than the height of the pocket storage areas so that portions of the integrated circuit protrude beyond the boundaries of the tray. Direct stacking of storage trays is not possible with such integrated circuits. One possible approach is to make trays of different depths to accommodate these differently sized integrated circuits. However, this eliminates the standardization of tray sizes that is highly desirable for use in automated assembly techniques.

SUMMARY OF THE INVENTION

Therefore it is an object of this invention to provide an economical device for facilitating the transportation and storage of electronic components, particularly pin grid array integrated circuit components, in storage trays of standard size.

Another object of this invention is to provide a device facilitating the stacking of trays for storing and transporting electronic components, particularly pin grid array integrated circuit components, that accurately positions the terminal pins from such components.

Another object of this invention is to provide a spacer tray for stacking storage and transportation devices for electronic components, particularly pin grid array integrated circuit components, that protects terminal pins emanating from such components from mechanical shock.

Yet still another object of this invention is to provide a spacer device that facilitates the stacking of storage devices for storing and transporting electronic components, particularly pin grid array integrated circuit components, to facilitate manual and automated handling techniques for such electronic components.

In accordance with this invention, a plurality of storage trays store integrated circuits in discrete storage pocket areas defined by an open framework. Portions of the framework define a peripheral wall of a predetermined height having first and second complementary engagement means on opposite edges of the peripheral wall. When a storage tray receives an oversized integrated circuit that protrudes beyond a plane through an edge of the peripheral wall, a spacer tray is interposed between adjacent storage trays to accommodate the extensions of the integrated circuit. The spacer tray includes an open framework that defines discrete pocket areas corresponding in position to the storage pocket areas. A peripheral wall of the spacer tray has first and second engaging means on opposite edges that correspond to the first and second engaging means on each storage tray so that the engaging means interfit to lock the spacer tray and adjacent storage tray together. Integrated circuit retaining means extend from the spacer tray framework means and span portions of the pocket areas thereby to overlie the integrated circuit in an adjacent storage tray and retain the integrated circuit in the storage tray.

BRIEF DESCRIPTION OF THE DRAWINGS

The appended claims particularly point out and distinctly claim the subject matter of this invention. The various objects, advantages and novel features of this invention will be more fully apparent from a reading of the following detailed description in conjunction with the accompanying drawings in which like reference numerals refer to like parts, and in which:

FIG. 1 is a perspective view of a storage tray that is constructed in accordance with this invention for storing and transporting electronic components and a template for facilitating the manual placement of such components in the device;

FIG. 2 is a top view of one embodiment of a storage tray as shown in FIG. 1;

FIG. 3 is an enlarged cross-sectional view taken along lines 3—3 in FIG. 2;

DESCRIPTION OF ILLUSTRATIVE EMBODIMENTS

Figure 4:
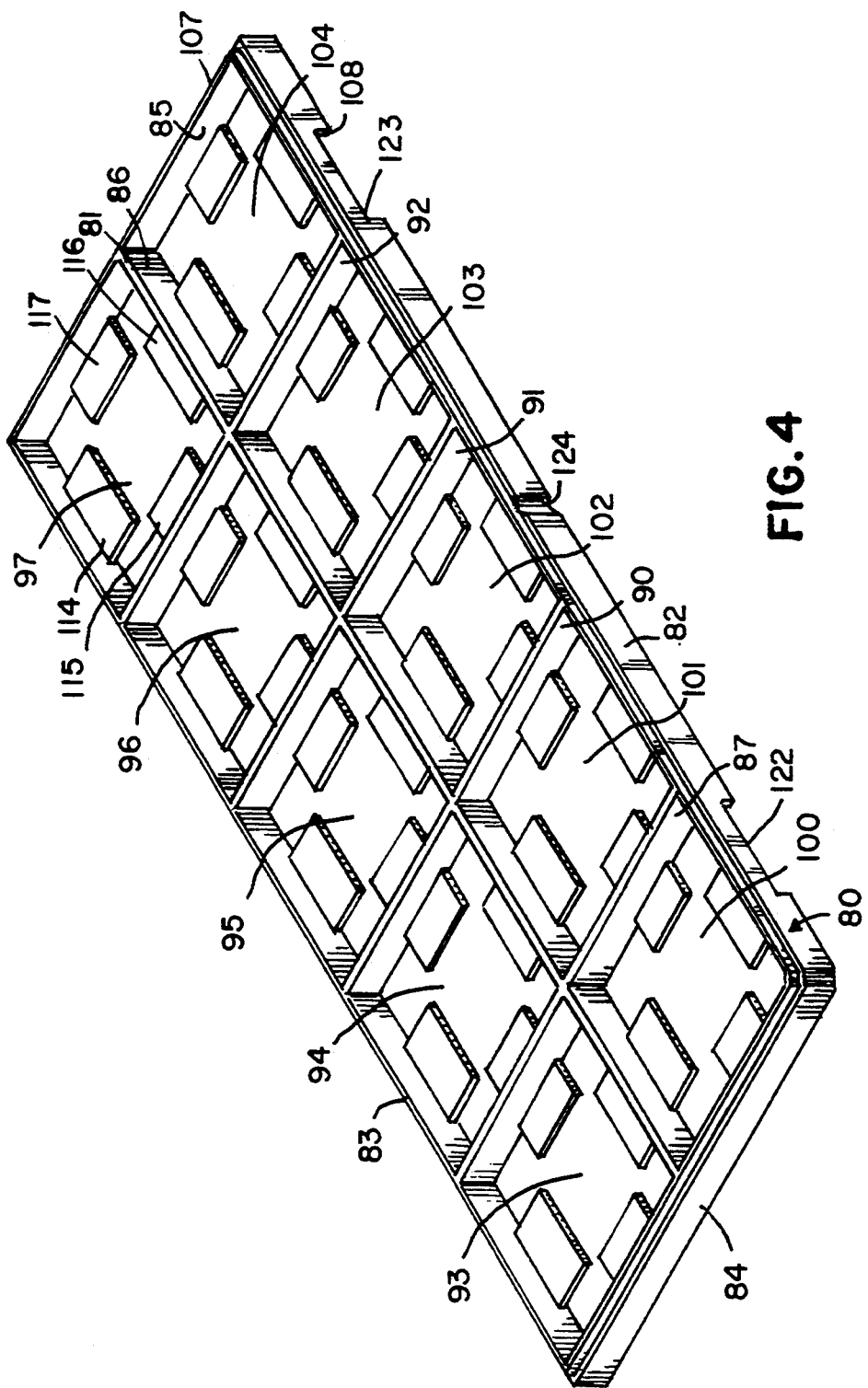
FIG. 4 is a perspective view of a spacer tray constructed in accordance with this invention.

A device for storing and transporting integrated circuit components or the like constructed in accordance with one aspect of this invention comprises a tray 10 as shown in FIG. 1. In this particular embodiment the tray 10 carries a number of pin grid array integrated circuit components (called "PGA components" in the following description) 11 through 17 at discrete locations. By way of example, the PGA component 11 has a planar ceramic housing 20 with a plurality of terminal pins 21 that extend transversely from a planar surface of the housing 20. In the orientation shown in FIG. 1, the terminal pins 21 extend downwardly from the housing 20 and are arranged in a two-dimensional matrix having columns 22 and rows 23 of terminal pins 21. Industry standards establish with accuracy the spacing and the diameter of the terminal pins 21. Typically the spacing is 0.100 inches and the terminal pin diameter is 0.018 inches. The area of the housing 20 depends upon the number of terminal pins.

A tray 10 as specifically shown in FIG. 1 is adapted to accept a PGA component with terminal pins 21 arranged in twenty-one columns 22 and twenty-one rows 23. In a typical component, the housing 20 has a maximum thickness of 0.135 inches, and the terminal pins 20 are 0.200 inches long. These dimensions are current industry standards, and they determine many of the spatial relationships in the tray 10 as will become apparent.

The tray 10 shown in FIG. 1 is an integrally molded device, typically of a conductive plastic. The conductive plastic may comprise any of a wide variety of easily molded, conductive and thermally and dimensionally stable materials. A carbon-filled polyether sulfone material is preferred. Other materials include carbon- or aluminum-filled polyether imides, polyaeryl sulfones and polyesters.

Referring now to FIGS. 1 through 3, the tray 10 has a lattice-like framework 24 that divides the tray 10 into an arbitrary number of rectangular or square discrete storage pocket areas. In the particular embodiment shown in FIG. 1, the framework 24 comprises a plurality of transverse beams that define ten storage pocket areas arranged in two columns and five rows. Specifically, the framework 24 comprises a front beam 25, a parallel spaced back beam 26, a left side beam 27 and a right side beam 30 that define the periphery of the tray 10. A center beam 31 extends midway between and parallel to the front and back beams 25 and 26. Intermediate center beams 32, 33, 34 and 35 extend transversely to the front and back beams 25 and 26. As shown particularly in FIGS. 1 and 2, the net effect of this particular framework 24 is a lattice with storage pocket areas 36 through 38 and 40 through 46 that individually receive PGA components.

The following description relates first to similar structures of each storage pocket area, in terms of the pocket storage area 46 shown in FIGS. 2 and 3, and then to differences among the various pocket storage areas. Specifically, the front beam 25, center beam 31, side beam 30 and intermediate beam 35 define the periphery storage pocket area 46 and support a base support means in the form of a planar base plate section 50. The base support plate section 50 has a cruciform shape with a plurality of integrally molded upstanding ribs extending perpendicularly to the plane of the base plate 50.

Still referring to the storage pocket area 46, ribs 55 and 56 are parallel to and spaced from the rib 51. The spacings between this first group of adjacent ribs 51, 55 and 56 are a multiple of the predetermined center-line spacing for terminal pins; in this embodiment the multiple is three. The distance between the counterfacing surfaces of adjacent pairs of the ribs 51, 55 and 56 corresponds to the dimension across the outside surfaces of adjacent columns or rows of terminal pins. A second group of parallel ribs 57, 60 and 61 having similar spacing are spaced from the set of ribs 51, 55 and 56.

Referring to FIGS. 1 and 2, the pocket storage area 46 additionally comprises a third group of upstanding ribs 62, 63 and 64 and a fourth set of upstanding ribs 65, 66 and 67. These ribs are parallel to each other and the third and fourth groups are spaced from each other. As a result the first and second group of ribs 51, 55, and 56 and 57, 60 and 61 are transverse to the third and fourth groups of ribs 62, 63 and 64 and 65, 66 and 67. The ribs 51, 62, 57 and 65 constitute a set of upstanding ribs, and the locus of this set of upstanding ribs is a rectangle, in this particular embodiment a square. The individual ribs of this set occupy only intermediate portions of the sides of the locus. Likewise, the locus of a second set of upstanding ribs 55, 63, 60 and 66 is a smaller concentric square. The locus of a third set of ribs 56, 64, 61 and 67 is a smaller concentric square. Thus, the upstanding rib means in any set are coextensive with intermediate portions of the sides of a rectangle or square that is concentric with and spaced from a rectangle or square that is the locus of another set of upstanding ribs. The spacing between the corresponding upstanding ribs in adjacent sets is a multiple of the spacing between the terminal pins; in this embodiment the multiple is two.

FIG. 3 depicts, in phantom, a PGA component 17 with its terminal pins extending downwardly. The tops of the upstanding ribs 63, 64, 66 and 67 engage the bottom of the PGA component housing and space the ends of the terminal pins from the base plate portion 50. The upstanding ribs 63, 64, 66 and 67 also are between the various terminal pins. In this figure, the integrated circuit 17 has a terminal pin array of fifteen columns and fifteen rows so the outer upstanding ribs 62 and 65 do not contact the housing of the integrated circuit 17. This configuration isolates the terminal pins from any mechanical shock due to external forces.

As each upstanding rib is coextensive with only a portion of the side of its respective locus, the corners are open or free of any ribs. This open construction provides two advantages. First, it enables the tray 10 to support PGA components having either an odd or even number of rows and columns of terminal pins. PGA components with an odd number of columns and rows center in the pocket storage area; those with even number offset diagonally from the center. Some PGA components have pads at the corner pins, and this construction prevents the ribs from contacting such pads.

The center spacings between opposed groups of parallel ribs, such as the distance between the upstanding ribs 56 and 61 in the first and second groups, also correspond to terminal pin spacing. In a particular example, the center-line distance between the upstanding ribs 56 and 61 is nine times the terminal pin center-line spacing.

Centrally disposed slots or access passages between adjacent pocket storage areas facilitate manual removal of the PGA components. For example, the intermediate beam 32 in FIG. 1 has a slot 70 formed in the upper surface centrally with respect to pocket storage areas 36 and 37. A centrally disposed slot 71 centers along the intermediate beam 32 with respect to the pocket storage areas 42 and 43. These slots enable an individual to grasp the edge of a PGA component more readily.

The front beam 25 of the lattice framework shown in FIG. 1 has a slot or pick point 72 formed proximate the pocket storage area 42 and a similar pick point 73 proximate the pocket storage area 46. Similar constructions on the back beam 26 facilitate automated handling of the trays, even in a stacked position.

The front beam 25 contains a centrally disposed vertical depression 74. When storage trays 10 are stacked properly, the depressions in all the trays align. A misalignment is apparent visually because such a misalignment breaks the general line that the depressions form when all the trays are oriented in the same position in the stack.

FIG. 4 discloses one embodiment of a spacer tray 80 constructed in accordance with this invention. It is designed for interposition between adjacent stacked storage trays 10, such as shown in FIGS. 1 through 3, and enables the trays 10 to accommodate integrated circuit components that protrude beyond the storage pocket areas of the storage tray 10.

Any particular embodiment of a storage tray 80 will conform generally to the structure of the storage tray 10. As shown in FIG. 4, the spacer tray 80 has open lattice-like framework 81. This framework 81 comprises a plurality of transverse beams that define ten pocket areas arranged in two columns and five rows like the storage tray 10. Specifically the framework 81 comprises a front beam 82, a parallel spaced back beam 83, a left side beam 84 and a right side beam 85 that define the periphery of the tray 80 and that constitute a peripheral wall of a predetermined height. A center beam 86 extends midway between and parallel to the front and back beams 82 and 83. A left outer beam 87, a left center beam 90, a right center beam 91 and a right outer beam 92 extend transversely between the front and back beams 82 and 83. As shown in FIG. 4, the net effect of this particular framework 71 is a lattice with pocket areas 93 through 97 positioned adjacent to one another between the back beam 83 and the center beam 86 and another set of pocket areas 100 through 104 between the front beam 82 and the center beam 86.

Figure 5:
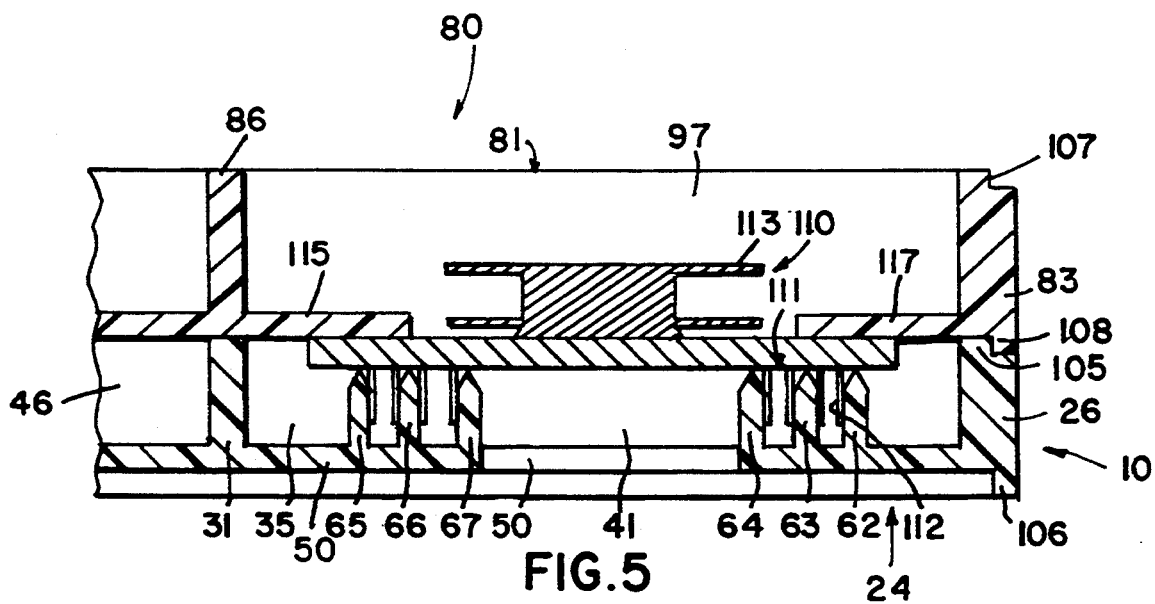
FIG. 5 is an enlarged cross-sectional view taken generally along lines 4—4 of FIG. 1 that depicts the orientation of a storage tray stacked with one embodiment of a spacer tray.

Referring to FIG. 5, the storage tray 10 has an upper inner lip 105 about an upper surface of a peripheral wall formed by the beams 25, 26, 27 and 30 and an outer lower lip 106 about the bottom of the tray 10. The lips 105 and 106 constitute first and second complementary engaging means on opposite edges of the peripheral wall. The framework 81 also contains an inner upper lip 107 and a lower outer lip 108 that constitute first and second engagement means on opposite edges of the open framework 81 about its periphery. Thus, as shown in FIG. 5 when a spacer tray 80 is positioned above a storage tray 10, the inner upper lip 105 on the storage tray 10 interlocks with the outer lower lip 108 on the storage tray 80 thereby to lock the two trays together and prevent horizontal displacement of one tray with respect to the other.

Figure 6:
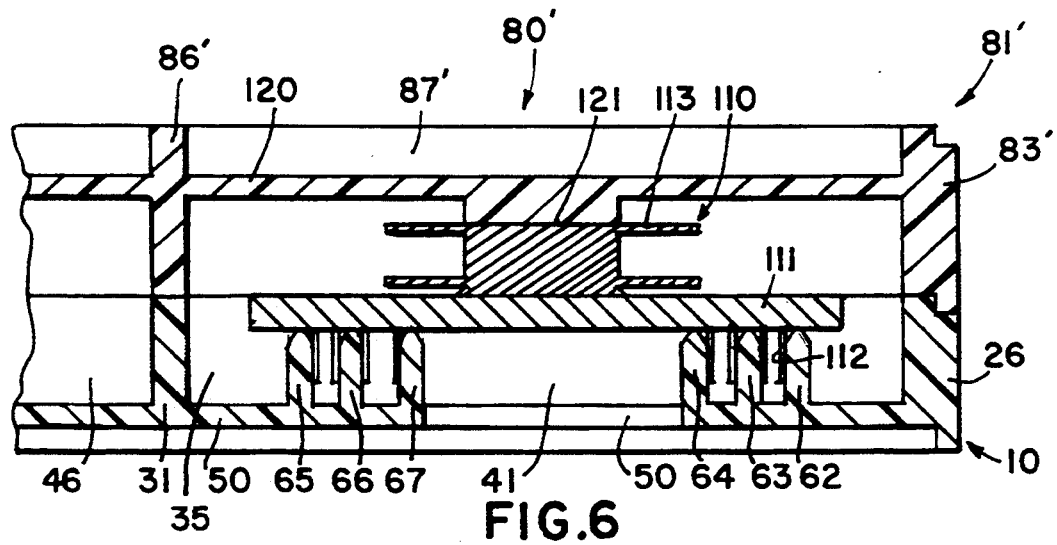
FIG. 6 is a cross-sectional view taken along lines 4—4 of FIG. 1 that depicts the orientation of a device as shown in FIG. 1 stacked with a spacer tray in accordance with FIG. 4 for engaging another embodiment of an integrated circuit.

FIGS. 5 and 6 disclose an integrated circuit component 110 that can be accommodated in the storage tray 10 augmented by the spacer tray 80. As shown in FIGS. 5 and 6 the integrated circuit 110, like the integrated circuits shown in FIGS. 1 and 3, has a ceramic housing 111 and a plurality of depending terminal pins 112. However, the integrated circuit 110 also has a structure that increases the overall height of its profile so portions protrude above the storage tray 10. In FIGS. 5 and 6 this additional structure is in the form of a heat sink 113. The integrated circuit, therefore, protrudes beyond a plane that lies at the top of the storage tray 10 shown in FIG. 1 (i.e., at the top of the upper inner lip 105). This prevents the stacking of adjacent storage trays 10 because the bottom portion of an upper storage tray 10 would lie on the heat sink 113, and the upper peripheral wall formed by the upper storage tray would be spaced from the storage tray below it.

As shown in FIGS. 5 and 6, in a typical horizontal orientation of a storage tray 10, the storage tray has a predetermined height between an upper horizontal plane at the top of the inner upper lip 105 and a horizontal plane which is coextensive with the bottom of the integrated circuit 110 and with the tops of the various upstanding ribs such as the ribs 62 through 67 shown in FIGS. 5 and 6.

The spacer tray 80 provides a displacement between adjacent storage trays that allows an upper storage tray to be separated from a lower storage tray so there is no interference between the integrated circuit 110 and an upper storage tray (not shown in FIGS. 5 or 6). The spacer tray 80 also provides another function. The spacer tray 80 retains the integrated circuit 110 in the storage tray 10. This particular embodiment of an integral retaining means is the same in each of the pocket areas 93 through 77 and 100 through 104 in the tray of FIG. 4, so only the pocket area 97 is discussed in detail. More specifically, a horizontal tab 114 extends toward the center of the pocket area 97 and is molded integrally with the back beam 83. When the spacer tray 80 is stacked on the storage tray 10 as shown in FIG. 5, the bottom surface of the tab 114 overlies the upper surface of the housing 111 adjacent an edge of the housing 111. The tab 114 is centrally located along the length of the back beam 83 within the pocket area 97. Similar tabs 115, 116 and 117 are molded integrally with the right outer beam 92, the center beam 86 and the right outer beam 85 respectively. Thus, the tabs 114 through 117 form a retaining means that extends from the spacer tray framework 81 and spans portions of the pocket areas for the purpose of overlying the integrated circuits stored in the storage pocket areas of an adjacent storage tray and retaining them in position. FIG. 4 discloses a retention means comprising four tabs. It will be apparent that other numbers of tabs or other structures could provide the same retention function.

FIG. 6 discloses an alternate retention device portion of a spacer tray 80' in the area of a pocket area 97' is shown as being seated on a storage tray 10 carrying an integrated circuit 110. In the spacer tray 80', a web 120 extends between the back beam 83' and the center beam 86'. The web 120 carries a pad portion 121 that overlies the heat sink 113 or similar structure to provide retention. As will be apparent in this embodiment, the height of the integrated circuit from the reference plane across the tops of the upstanding ribs 62 through 67 to the top of the heat sink 113 determines the spacing between the bottom surface of the pad 121 and the plane through the tops of the upstanding ribs 62 through 67. Thus, in this embodiment the retention means engages an upper surface of the heat sink 113, that is representative of any auxiliary integrated circuit structure, and extends from the open framework 81'.

In each of these embodiments, it will be apparent that the integrated circuit retaining means only partially close each pocket area. This facilitates manufacture and increases the dimensional stability of the tray.

A spacer tray may also incorporate other features of a storage tray. For example, the spacer tray 80 in FIG. 4 includes slots or pick points 122 and 123. These are analogous to the pick points 72 and 73 shown in the storage tray 10. Similarly, the spacer tray 80 in FIG. 4 has a depression 124 that cooperates with the depression 74 in FIG. 1. Although end-to-end orientation of the spacer tray 80 is not critical, the depression 124 facilitates the identification of misoriented storage trays 10.

Figure 7:
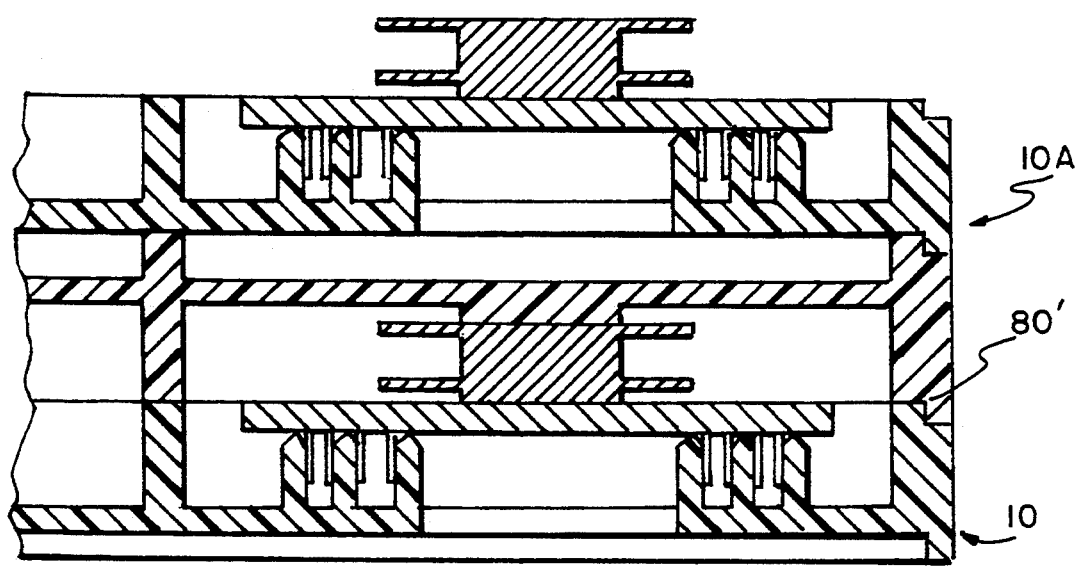
FIG. 7 is a cross-sectional view taken along lines 4—4 of FIG. 1 that depicts a spacer tray shown in FIG. 4 intermediate two storage trays of the type shown in FIGS. 1 through 3.

FIG. 7, for example, depicts a spacer tray 80' of the form interposed between a storage tray 10 of the type shown in FIGS. 1 through 3 and 6 and a similar or identical tray 10A.

Therefore in accordance with this invention, a spacer tray 80 as shown in FIGS. 4 and 5 or an alternative tray 80' shown in FIG. 6, can be interposed between adjacent storage trays 10 thereby to enable the storage trays 10 to accommodate large integrated circuits that protrude beyond the periphery of the storage trays 10. In accordance with this invention each of the spacer trays has means for locking it to adjacent storage trays thereby to provide horizontal stability. Moreover, each of the spacer trays 80 and 80' has retaining means for overlying integrated circuits in an adjacent storage tray 10 thereby to retain the integrated circuits in the storage tray 10.

This invention has been disclosed in terms of certain embodiments. It will be apparent that many modifications can be made to the disclosed apparatus without departing from the invention. For example, the spacer trays 80 and 80' shown in FIGS. 4 through 6 are specifically constructed to complement the storage trays 10 of FIGS. 1 through 3. If the configuration of those storage trays 10 changes, a corresponding change is made to the configuration of the spacer tray. The particular embodiment discloses an inner engagement means for allowing the interfitting of adjacent storage and spacer trays in the forms of complementary lips formed about a peripheral wall of the spacer tray and storage trays. Other equivalent structures could be adopted within the scope of this invention. Two specific spacer tray embodiments with different structures for engaging and retaining the integrated circuit in a storage tray are disclosed. A number of other such structures can be adapted to other spacer tray constructions. Therefore, it is the intent of the appended claims to cover all such variations and modifications as come within the true spirit and scope of this invention.

What is claimed as new and desired to be secured by Letters Patent of the United States is:

1. A spacer tray for interposition between two storage trays for integrated circuits wherein, in a horizontal orientation of the storage trays, each integrated circuit has a housing means with horizontal top and bottom surfaces and terminals extending therefrom, wherein each storage tray has framework portions for defining discrete storage pocket areas for supporting the integrated circuits and a peripheral wall having top and bottom edges with first and second complementary engaging means on top and bottom edges respectively and with a predetermined depth between an upper horizontal plane at the top peripheral wall edge and a horizontal plane coextensive with the bottom surface of a stored integrated circuit and wherein the integrated circuit housing means protrudes beyond the upper horizontal plane, sad spacer tray comprising:

A. open framework means coextensive with the storage tray framework with portions defining discrete pocket areas and a peripheral wall of a predetermined height having top and bottom edges with first and second engaging means respectively that interlock with the second and first engaging means of adjacent storage trays respectively thereby to position said spacer tray with respect to an adjacent storage tray, and B. tab means for overlying a portion of the top housing surface, said tab means extending from said storage tray framework, partially spanning from said spacer tray pocket area and being offset from the storage tray support plane by a distance corresponding to the integrated circuit height thereby to retain an integrated circuit stored in a storage pocket area of a storage tray below said spacer tray.

2. A spacer tray as recited in claim 1 wherein each of sad spacer tray and the storage tray pocket areas have a rectangular form, said tab means in each said pocket storage means including a tab extending from said framework means on each side of a said pocket storage area thereby to overlie each integrated circuit housing means at plural positions about the edges thereof.

3. A spacer tray for interposition between two storage trays for integrated circuits wherein, in a horizontal orientation of the storage trays, each integrated circuit has a housing means with a planar housing having horizontal top and bottom surfaces, auxiliary means disposed on the top of the planar housing and terminals extending therefrom, wherein each storage tray has framework portions for defining discrete storage pocket areas for supporting the integrated circuits and a peripheral wall having top and bottom edges with first and second complementary engaging means on top and bottom edges respectively and with a predetermined depth between an upper horizontal plane at the top peripheral wall edge and a horizontal plane coextensive with the bottom surface of a stored integrated circuit and wherein the integrated circuit housing means protrudes beyond the upper horizontal plane, said spacer tray comprising:
- A. open framework means coextensive with the storage tray framework with portions defining discrete pocket areas and a peripheral wall of a predetermined height having top and bottom edges with first and second engaging means respectively that interlock with the second and first engaging means of adjacent storage trays respectively thereby to position said spacer tray with respect to an adjacent storage tray, and
- B. integrated circuit retaining means for retaining an integrated circuit in a storage pocket of a storage tray below said spacer tray, said retaining means including pad means for overlying the auxiliary means and supporting web means extending from said framework means for supporting said pad means in alignment with the auxiliary means and at a distance form the support plane that depends upon the overall height of the integrated circuit.

4. A spacer tray for interposition between two storage trays for integrated circuits wherein each integrated circuit has a housing means and terminals extending therefrom and wherein each storage tray has a framework with portions for defining discrete storage tray pocket areas for the integrated circuits and portions for defining a peripheral wall of a predetermined height with first and second complementary engaging means on opposite edges of the peripheral wall, each storage tray pocket area, in a horizontal orientation, having a predetermined depth between an upper horizontal plane at the top edge of the storage tray peripheral wall and a horizontal plane coextensive with the bottom of the integrated circuit stored therein, the integrated circuit housing means protruding beyond the upper horizontal plane, said spacer tray comprising:
- A. an open framework means coextensive with the storage tray framework for defining discrete spacer tray pocket areas and a peripheral wall of a predetermined height with first and second engaging means on opposite edges of said peripheral wall and corresponding with the first and second engaging means on adjacent storage trays, respectively, for interlocking with the second and first engaging means on adjacent storage trays respectively thereby to interpose said spacer tray between the storage trays, and
- B. integrated circuit retaining means extending from said spacer tray and spanning portions of said spacer tray pocket areas for engaging the integrated circuit housing means thereby to retain integrated circuits stored in the storage pocket areas of one of the adjacent storage trays, said integrated circuit retaining means being positioned when a storage tray and a said spacer tray are interlocked with a surface in a horizontal spacer tray plane that is offset form the storage tray support plane by a distance corresponding to the integrated circuit height.

5. A spacer tray as recited in claim 4 wherein each said integrated circuit retaining means in each said spacer tray pocket area partially closes said spacer tray pocket area.

6. A system of storage and spacer trays that facilitates the individual storage of integrated circuits in and the stacking of plural storage trays wherein each integrated circuit has a housing means and terminals extending therefrom and wherein:
- A. each said storage tray comprises:
  - i. framework means for defining a plurality of storage pocket areas and a peripheral wall of a predetermined height with first and second complementary engaging means on opposite edges of said peripheral wall,
  - ii. base support means spanning said portions of said framework means for forming said storage pocket areas, and
  - iii. a set of upstanding rib means within each said storage pocket area extending from said base support means for engaging the integrated circuit housing means in said storage pocket area, the integrated circuit having a portion of its housing means protruding above said framework means, and
- B. each said spacer tray comprises:
  - i. an open framework means coextensive with said storage tray framework means for defining discrete pocket areas and a peripheral wall of a predetermined height with first and second engaging means on opposite edges that interlock with corresponding ones of the second and first engaging means on each said storage tray thereby to position said spacer tray with respect to ones of said storage trays, and
  - ii. integrated circuit retaining means extending from said spacer tray framework means and spanning portions of said spacer tray pocket areas for engaging the integrated circuit housing means thereby to retain integrated circuits stored in said storage pocket areas of an adjacent one of said storage trays.

7. A system of storage and spacer trays as recited in claim 6 wherein said upstanding rib means define a horizontal support plane for the integrated circuit and the integrated circuit housing means protrudes beyond an upper parallel plan through the top of the edges of said peripheral wall of said storage tray, said integrated retaining means at each said spacer pocket area being positioned when said first and second engaging means of said storage tray and said spacer tray interlock, to overlie a surface of the integrated circuit housing means in said corresponding storage pocket area of said storage tray thereby to retain the integrated circuit in storage tray.

8. A system of storage and spacer trays as recited in claim 7 wherein each said storage tray pocket area, in a horizontal orientation, has a predetermined depth between the upper plane and the horizontal support plane, said integrated circuit retaining means on said spacer tray being positioned with a surface in a horizontal plane that is offset from the storage tray support plane by a distance dependent upon the integrated circuit housing means height when said storage tray and said spacer are interlock.

9. A system of storage and spacer trays as recited in claim 8 wherein the integrated circuit housing means has a horizontal upper housing surface, said integrated circuit retaining means comprising tab means extending from said spacer tray framework means and partially spanning said spacer tray pocket area for overlying a portion of the horizontal upper housing surface.

10. A system of storage and spacer trays as recited in claim 9 wherein each of said spacer tray and storage tray pocket areas have a rectangular form, said tab means in each said pocket area of said spacer tray including a tab extending from said open framework means on each side of the pocket area thereby to overlie each integrated circuit at plural positions about the edges thereof.

11. A system of storage and spacer trays as recited in claim 9 wherein said open framework means in each of said storage trays and spacer trays comprises an open matrix of interconnected transverse beams that define said pocket areas, said beams forming said spacer tray open framework means supporting said tab means.

12. A system of storage and spacer trays as recited in claim 11 wherein said tab means in each said spacer tray pocket area partially close sad pocket area thereby to overlie at least a portion of an integrated circuit in a corresponding storage pocket area of a storage tray.

13. A system of storage and spacer trays as recited in claim 11 wherein each of said spacer tray and the storage tray pocket areas have a rectangular form, said tab means in each said pocket area including a tab extending from said framework means on each side of a said pocket area thereby to overlie each integrated circuit at a plural positions about the edges thereof.

14. A system of storage and spacer trays as recited in claim 8 wherein the integrated circuit housing means has a planar hosing and an auxiliary means disposed on the planar housing that protrudes above the upper plane, said retaining means for each said pocket area of said spacer tray comprising a pad means for overlying the upper surface of the auxiliary means and supporting web means extending from said open framework means for supporting said pad means at a distance from the support plane that depends upon the overall height of the integrated circuit.

* * * * *